United States Patent
Morikado

(10) Patent No.: US 7,433,234 B2
(45) Date of Patent: Oct. 7, 2008

(54) FLOATING-BODY CELL (FBC) SEMICONDUCTOR STORAGE DEVICE HAVING A BURIED ELECTRODE SERVING AS GATE ELECTRODE, AND A SURFACE ELECTRODE SERVING AS PLATE ELECTRODE

(75) Inventor: Mutsuo Morikado, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 313 days.

(21) Appl. No.: 11/296,311

(22) Filed: Dec. 8, 2005

(65) Prior Publication Data

US 2006/0157785 A1 Jul. 20, 2006

(30) Foreign Application Priority Data

Dec. 9, 2004 (JP) ............................. 2004-356868

(51) Int. Cl.
*G11C 11/404* (2006.01)
*H01L 27/01* (2006.01)
(52) U.S. Cl. ..................... 365/185.18; 365/185.26; 365/185.27; 257/350; 257/347
(58) Field of Classification Search ............ 365/185.26, 365/185.1, 185.18, 185.27, 150, 149; 257/350, 257/347
See application file for complete search history.

(56) References Cited

U.S. PATENT DOCUMENTS

| | | | |
|---|---|---|---|
| 4,954,991 A * | 9/1990 | Saeki et al. ............ 365/185.23 |
| 5,050,124 A * | 9/1991 | Saeki et al. ................... 365/104 |
| 5,447,884 A * | 9/1995 | Fahey et al. ................... 438/437 |
| 6,377,489 B1 * | 4/2002 | Kim et al. ............... 365/185.26 |
| 6,621,725 B2 | 9/2003 | Ohsawa |
| 7,088,623 B2 * | 8/2006 | Huang .................... 365/185.29 |
| 2007/0230234 A1 * | 10/2007 | Ohsawa ...................... 365/150 |
| 2007/0242526 A1 * | 10/2007 | Morikado et al. ....... 365/189.01 |

FOREIGN PATENT DOCUMENTS

| | | | |
|---|---|---|---|
| JP | 6-216329 | * | 8/1994 |
| JP | 2006-164447 | * | 6/2006 |
| JP | 2007-287975 | * | 11/2007 |

* cited by examiner

*Primary Examiner*—Andrew Q Tran
(74) *Attorney, Agent, or Firm*—Oblon, Spivak, McClelland, Maier & Neustadt, P.C.

(57) ABSTRACT

A semiconductor storage device including a memory cell. In the memory cell a buried electrode is formed on a semiconductor substrate. A semiconductor layer is formed on the buried electrode via a buried insulating film. A surface electrode is formed on the semiconductor layer via an insulating film. A source region and drain region are formed in the semiconductor layer on both sides of the surface electrode with a predetermined spacing therebetween. A floating body is formed between the source region and drain region, which stores data in accordance with whether holes are stored in the floating body. The buried electrode serves as a gate electrode, and the surface electrode serves as a plate electrode.

12 Claims, 3 Drawing Sheets

FLOATING-BODY CELL (FBC) SEMICONDUCTOR STORAGE DEVICE HAVING A BURIED ELECTRODE SERVING AS GATE ELECTRODE, AND A SURFACE ELECTRODE SERVING AS PLATE ELECTRODE

CROSS REFERENCE TO RELATED APPLICATION

This application is based upon and claims benefit of priority under 35 USC §119 from the Japanese Patent Application No. 2004-356868, filed on Dec. 9, 2004, the entire contents of which are incorporated herein by reference.

BACKGROUND OF THE INVENTION

The present invention relates to a semiconductor storage device.

Recently, an FBC (Floating Body Cell) memory is developed as a semiconductor memory which replaces a DRAM. In this FBC memory, a transistor is formed on an SOI (Silicon On Insulator) substrate. Data "1" is stored by storing holes in a floating body of the formed transistor, and data "0" is stored by discharging holes from the floating body.

More specifically, to write data "1" in the FBC, the electric potential of the gate electrode is set at, e.g., 1.5 V and the electric potential of the drain region is set at 1.5 V to cause the FBC to perform a so-called pentode operation, thereby storing holes generated by impact ionization into the floating body.

To write data "0" in the FBC, the electric potential of the gate electrode is set at, e.g., 1.5 V and the electric potential of the drain region is set at −1.5 V to bias the p-n junction between the floating body and drain region in the forward direction, thereby discharging holes stored in the floating body onto a bit line.

Accordingly, when data "1" is written in the FBC and holes are stored in the floating body, the electric potential of the floating body is high, so the gate threshold voltage is low. On the other hand, when data "0" is written in the FBC and no holes are stored in the floating body, the electric potential of the floating body is low, so the gate threshold voltage is high.

To read out data from the FBC, therefore, the electric potential of the gate electrode is set at, e.g., 1.5 V and the electric potential of the drain region is set at 0.2 V to cause the FBC to perform a so-called triode operation, so as not to destroy the data.

If data "1" is written in the FBC and holes are stored in the floating body, the gate threshold voltage is low, so the drain current (cell current) is large. On the other hand, if data "0" is written in the FBC and no holes are stored in the floating body, the gate threshold voltage is high, so the drain current (cell current) is small.

Accordingly, whether data "1" or "0" is written in the FBC as data to be read out from it is determined by checking whether the cell current is large or small on the basis of the gate threshold voltage difference.

If the gate threshold voltage difference is increased, the cell current difference also increases, so data to be read out from the FBC can be accurately determined. As a method of increasing the gate threshold voltage difference, the capacity of the floating body can be increased.

That is, when the capacity of the floating body is increased, it is possible to decrease the reduction with time of holes stored in the floating body. This suppresses the decrease in gate threshold voltage difference with time. Consequently, the gate threshold voltage difference becomes larger than that when the capacity of the floating body is small.

The capacity of the floating body is inversely proportional to the film thickness of a buried insulating film, and proportional to the contact area between the floating body and buried insulating film. As a method of increasing the capacity of the floating body, therefore, it is possible to decrease the film thickness of the buried insulating film, or increase the contact area between the floating body and buried insulating film.

In the method of decreasing the film thickness of the buried insulating film, however, if the buried insulating film is evenly thinned over the entire surface of the SOI substrate, a logic gate transistor to be formed in a region except for a prospective FBC region becomes difficult to design. In addition, if the film thickness of the buried insulating film in the prospective FBC region is changed from that in the other region, the fabrication process is complicated.

Furthermore, in the method of increasing the contact area between the floating body and buried insulating film, increasing the size of the FBC makes high integration difficult. In addition, if a plate electrode is also formed on the side surfaces of the floating body via the buried insulating film, the process is complicated, and the yield decreases.

A reference pertaining to the FBC memory is as follows.
Japanese Patent Laid-Open No. 2004-111643.

SUMMARY OF THE INVENTION

According to one aspect of the invention, there is provided a semiconductor storage device having a memory cell, comprising:

a buried electrode formed on a semiconductor substrate;

a semiconductor layer formed on said buried electrode via a buried insulating film;

a surface electrode formed on said semiconductor layer via an insulating film;

a source region and drain region formed in the semiconductor layer on both sides of said surface electrode with a predetermined spacing therebetween; and a floating body formed between said source region and drain region, and which stores data in accordance with whether holes are stored in said floating body, wherein said buried electrode serves as a gate electrode, and said surface electrode serves as a plate electrode.

DETAILED DESCRIPTION OF THE INVENTION

Embodiments of the present invention will be described below with reference to the accompanying drawings.

Figure 1:
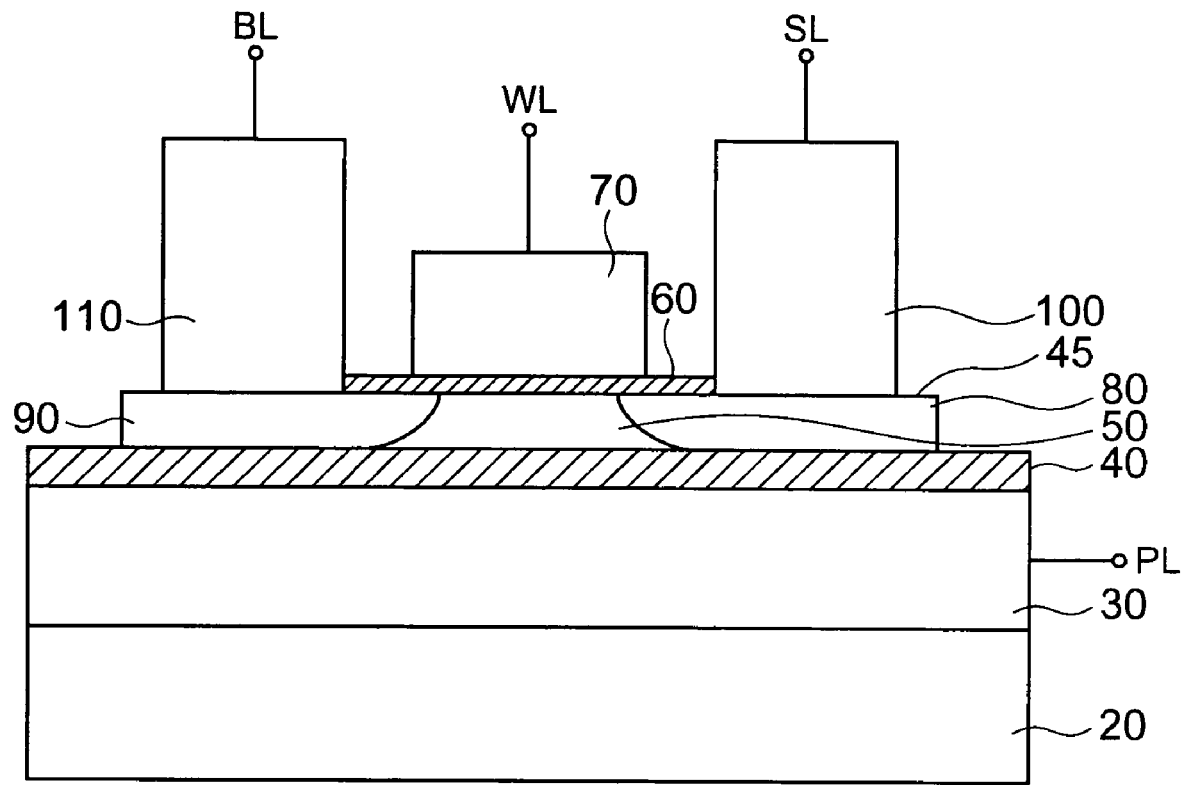
FIG. 1 is a longitudinal sectional view showing the sectional structure of an FBC according to an embodiment of the present invention.

FIG. 1 shows the arrangement of an FBC 10 as a memory cell used in an FBC memory according to an embodiment of the present invention. A buried electrode 30 is formed on a semiconductor substrate 20, and a semiconductor layer 45 is formed on the buried electrode 30 via a buried insulating film 40. A surface electrode 70 is formed on the semiconductor layer 45 via an insulating film 60.

A source region 80 and drain region 90 are formed in the two end portions of the semiconductor layer 45. A floating body 50 which is in an electrically floating state is formed between the source region 80 and drain region 90. Also, contact plugs 100 and 110 are formed on the source region 80 and drain region 90, respectively.

In this embodiment, the buried electrode 30 equivalent to the conventional plate electrode serves as a gate electrode, and the surface electrode 70 equivalent to the conventional gate electrode serves as a plate electrode. Therefore, the capacity of the floating body 50 is inversely proportional to the film thickness of the insulating film 60 equivalent to the conventional gate insulating film, rather than the film thickness of the buried insulating film 40.

Accordingly, if the film thickness of the insulating film 60 is decreased to, e.g., 40 to 45 Å, the capacity of the floating body 50 can be increased without decreasing the film thickness of the buried insulating film 40. This makes it possible to increase the gate threshold voltage difference, and accurately determine data to be read out from the FBC 10.

Also, in this embodiment, after the electric potentials of the surface electrode 70 which serves as a plate electrode and the buried electrode 30 which serves as a gate electrode are respectively fixed at predetermined electric potentials, the electric potentials of the source region 80 and drain region 90 are respectively changed to desired electric potentials. That is, in this embodiment, data read and write operations are executed by changing the electric potential difference between the source region 80 and buried electrode 30 and the electric potential difference between the source region 80 and drain region 90.

More specifically, the power supply voltage is set at, e.g., 3 V, the electric potential of the surface electrode 70 which serves as a plate electrode is fixed to 1.5 V, and the electric potential of the buried electrode 30 which serves as a gate electrode is fixed to 0 V. To write data "1" in the FBC 10, the electric potential of the source region 80 is set at, e.g., 0.75 V and the electric potential of the drain region 90 is set at 3V to supply an electric current to the channel region, thereby storing holes in the floating body 50, and raising the electric potential of the floating body 50 to about 1.5 V.

On the other hand, to write data "0" in the FBC 10, the electric potentials of both the source region 80 and drain region 90 are set at, e.g., 3 V to neutralize the floating body 50, thereby extinguishing holes stored in the floating body 50, and lowering the electric potential of the floating body 50 to about −0.5 V.

Accordingly, when data "1" is written in the FBC 10 and holes are stored in the floating body 50, the electric potential of the floating body 50 is high, so the gate threshold voltage is low. On the other hand, when data "0" is written in the FBC 10 and no holes are stored in the floating body 50, the electric potential of the floating body 50 is low, so the gate threshold voltage is high.

Note that to hold data written in the FBC 10, the electric potentials of both the source region 80 and drain region 90 are set at 1.5 V.

To read out data from the FBC 10, the electric potential of the source region 80 is set at, e.g., 1.5 V and the electric potential of the drain region 90 is set at 0.75 V or 0 V to suppress the generation of hot carriers, and cause the FBC 10 to perform a so-called pentode operation, so as not to destroy the data.

If data "1" is written in the FBC 10 and holes are stored in the floating body 50, the gate threshold voltage is low, so the drain current (cell current) is large. On the other hand, if data "0" is written in the FBC 10 and no holes are stored in the floating body 50, the gate threshold voltage is high, so the drain current (cell current) is small.

Accordingly, whether data "1" or "0" is written in the FBC 10 as data to be read out from it is determined by checking whether the cell current is large or small on the basis of the gate threshold voltage difference.

In this embodiment, the gate threshold voltage difference is increased by increasing the capacity of the floating body 50, so the cell current difference is large. This allows accurate determination of data to be read out from the FBC 10.

Also, to read or write data in this embodiment, the electric potential of the surface electrode 70 which serves as a plate electrode and the electric potential of the buried electrode 30 which serves as a gate electrode are respectively fixed to predetermined electric potentials. After that, the electric potential of the source region 80 is changed by 2.25 V within the range of 0.75 to 3 V, and the electric potential of the drain region 90 is changed by 2.25 V within the range of 0.75 to 3 V.

By contrast, in the conventional device, after the electric potentials of the buried electrode which serves as a plate electrode and the source region are fixed, the electric potential of the surface electrode which serves as a gate electrode is changed by 3 V within the range of −1.5 to 1.5 V, and the electric potential of the drain region is changed by 3 V within the range of −1.5 to 1.5 V.

As described above, the voltage width oscillated by a peripheral circuit for oscillating the voltage in this embodiment is smaller than that in the conventional device. This makes it possible to improve the reliability of the peripheral circuit, and reduce the power consumption.

Figure 2:
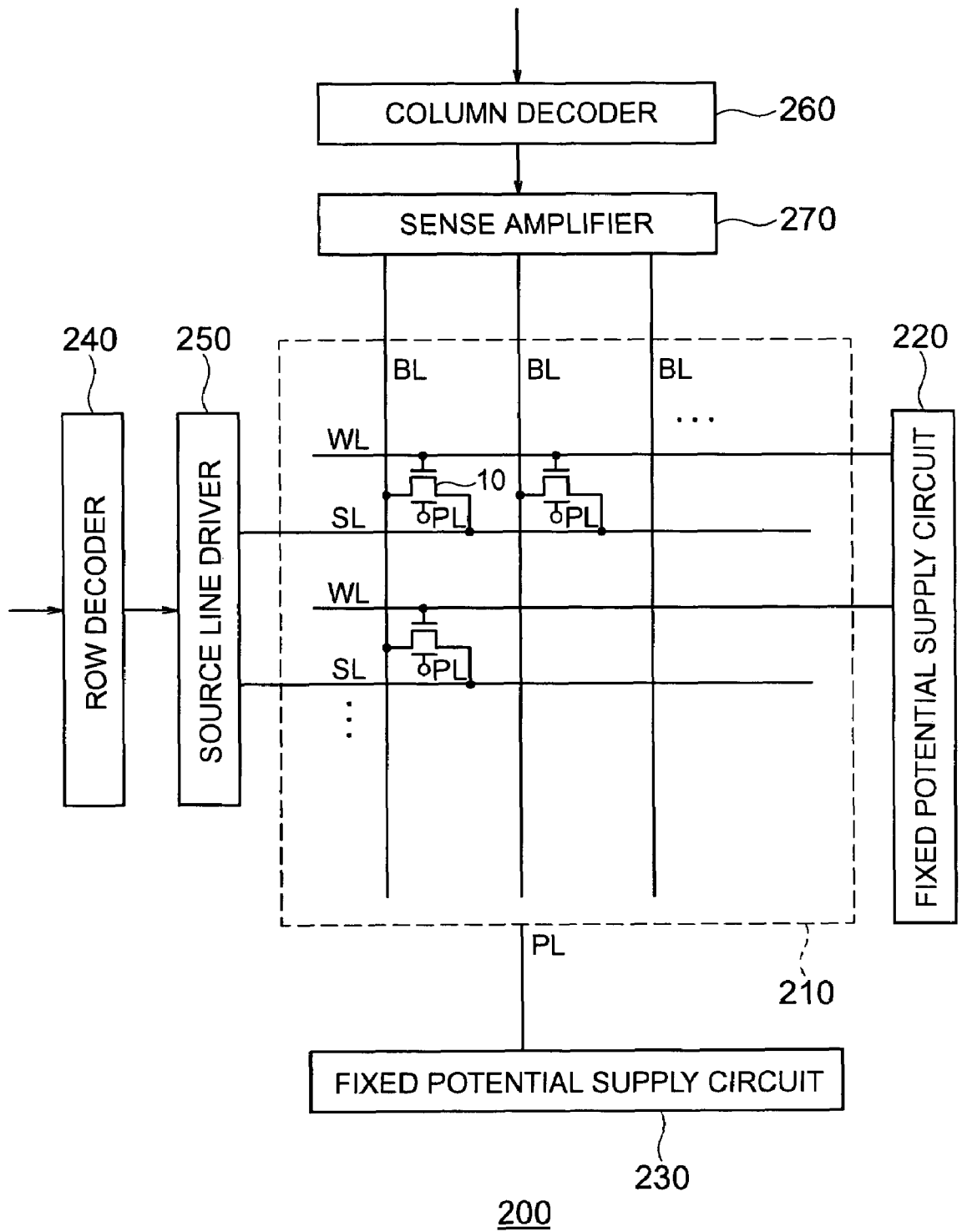
FIG. 2 is a block diagram showing the arrangement of an FBC memory according to the embodiment.

FIG. 2 shows the arrangement of an FBC memory 200 to which the FBC 10 is applied as a memory cell. A memory cell array 210 of the FBC memory 200 is formed by arranging the FBCs 10 in a matrix.

The surface electrodes 70 of the FBCs 10 are connected to word lines WL running along the row direction. The source electrodes 80 are connected to source lines SL running alternately with the word lines WL in the row direction. The drain regions 90 of the FBCs 10 are connected to bit lines BL running along the column direction.

A fixed potential supply circuit 220 is connected to the word lines WL, and fixes the electric potential of the surface electrode 70, which serves as a plate electrode of the FBC 10, to 1.5 V. A fixed potential supply circuit 230 is connected to the buried electrode 30 which serves as a gate electrode of the FBC 10, and fixes the electric potential of the buried electrode 30 to 0 V.

A row decoder 240 selects a desired source line SL on the basis of an externally supplied row address. A source line driver 250 sets the electric potential of the selected source line SL at 0.75, 3, and 1.5 V when data "1" is to be written, data "0" is to be written, and data is to be read out, respectively.

A column decoder 260 selects a desired bit line BL on the basis of an externally supplied column address. A sense amplifier 270 sets the electric potential of the selected bit line BL at 3 and 0 V when data is to be written and data is to be read out, respectively, thereby reading out data from or writing data in the selected FBC 10.

The semiconductor storage device of the above embodiment makes it possible to accurately determine data to be read out from a memory cell, and reduce the power consumption.

Figure 3:
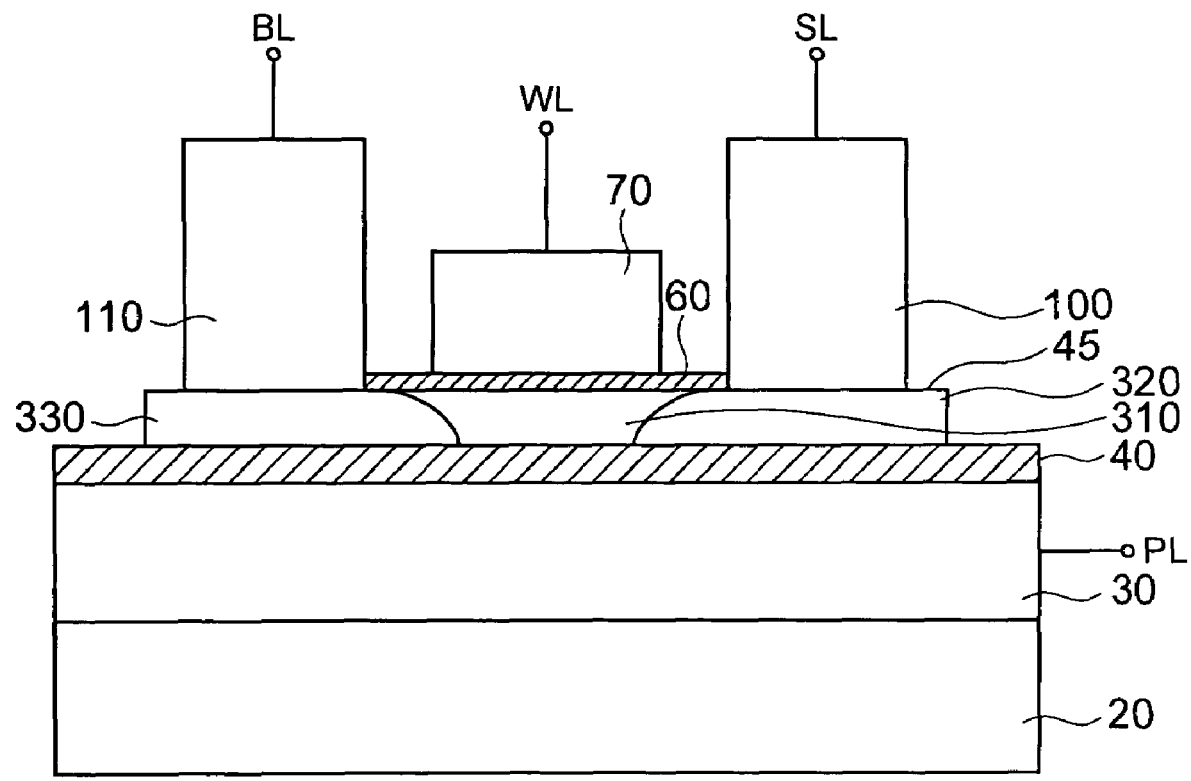
FIG. 3 is a longitudinal sectional view showing the sectional structure of an FBC according to another embodiment.

Note that the above embodiment is merely an example, and does not limit the present invention. For example, as shown in FIG. 3, to increase the capacity of a floating body 310, it is also possible to form a source region 320 and drain region 330 having a shape which increases the contact area between the floating body 310 and an insulating film 60.

In this case, when the acceleration energy as one ion implantation condition is raised to, e.g., 15 keV, an impurity such as phosphorus (P) can be deeply ion-implanted to the vicinity of the surface of a buried insulating film 40. This makes it possible to form the source region 320 and drain region 330 having a shape which increases the contact area between the floating body 310 and insulating film 60. Note that the same reference numerals as in FIG. 1 denote the same elements in FIG. 3, and an explanation thereof will be omitted.

What is claimed is:

1. A semiconductor storage device having a memory cell, comprising:
   a buried electrode formed on a semiconductor substrate;
   a semiconductor layer formed on said buried electrode via a buried insulating film;
   a surface electrode formed on said semiconductor layer via an insulating film;
   a source region and drain region formed in the semiconductor layer on both sides of said surface electrode with a predetermined spacing therebetween; and
   a floating body formed between said source region and drain region, and which stores data in accordance with whether holes are stored in said floating body,
   wherein when data is to be stored in, held in, and read out from said memory cell, said surface electrode is fixed at a first electric potential, and said buried electrode is fixed at a second electric potential lower than the first electric potential.

2. A device according to claim 1, wherein said source region and drain region have a shape by which a contact area between said floating body and insulating film is larger than a contact area between said floating body and buried insulating film.

3. A device according to claim 2, wherein when said source region and drain region are formed, an acceleration energy for ion implanting an impurity into said semiconductor layer is substantially 15 keV.

4. A device according to claim 1, wherein said insulating film has a film thickness of 40 to 45 Å.

5. A device according to claim 1, wherein when first data is to be stored in said memory cell, a third electric potential is applied to said source region, and a fourth electric potential higher than the third electric potential is applied to said drain region, and, when second data is to be stored in said memory cell, the fourth electric potential is applied to said source region and drain region.

6. A device according to claim 1, wherein when data stored in said memory cell is to be held, an electric potential intermediate between the third and fourth electric potentials is applied to said source region and drain region.

7. A device according to claim 1, wherein when data stored in said memory cell is to be read out, an electric potential intermediate between the third and fourth electric potentials is applied to said source region, and one of the third electric potential and a fifth electric potential lower than the third electric potential is applied to said drain region.

8. A device according to claim 1, further comprising:
   a memory cell array in which said memory cells are arranged in a matrix;
   a plurality of word lines running along a row direction of said memory cell array, and connected to said surface electrodes of said memory cells;
   a plurality of source lines running alternately with said word lines along the row direction of said memory cell array, and connected to said source regions of said memory cells;
   a plurality of bit lines running along a column direction of said memory cell array, and connected to said drain regions of said memory cells;
   a first electric potential supply unit connected to each word line to supply the first electric potential to said surface electrode of each memory cell;
   a second electric potential supply unit connected to said buried electrode of each memory cell to supply the second electric potential lower than the first electric potential to said buried electrode of each memory cell;
   a source line driver which selects a desired one of said plurality of source lines on the basis of an externally supplied row address; and
   a bit line driver which selects a desired one of said plurality of bit lines on the basis of an externally supplied column address.

9. A device according to claim 8, wherein when data is to be stored in, held in, and read out from said memory cell, said second electric potential supply unit fixes said buried electrode at the second electric potential, and said first electric potential supply unit fixes said surface electrode at the first electric potential.

10. A device according to claim 8, wherein
    when first data is to be stored in said memory cell, said source line driver applies a third electric potential to said source line, and said bit line driver applies a fourth electric potential higher than the third electric potential to said bit line, and
    when second data is to be stored in said memory cell, said source line driver and bit line driver apply the fourth electric potential to said source line and bit line, respectively.

11. A device according to claim 8, wherein when data stored in said memory cell is to be held, said source line driver and bit line driver apply an electric potential intermediate between the third and fourth electric potentials to said source line and bit line, respectively.

12. A device according to claim 8, wherein when data stored in said memory cell is to be read out, said source line driver applies an electric potential intermediate between the third and fourth electric potentials to said source line, and said bit line driver applies one of the third electric potential and an electric potential lower than the third electric potential to said bit line.

* * * * *